US012777717B2

(12) United States Patent
Wang et al.

(10) Patent No.: US 12,777,717 B2
(45) Date of Patent: Oct. 27, 2026

(54) ARRAY SUBSTRATE, DISPLAY PANEL AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Jianjun Wang, Beijing (CN); Xiaona Liu, Beijing (CN); Bingyue Wang, Beijing (CN)

(73) Assignees: BEIJING BOE DISPLAY TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 184 days.

(21) Appl. No.: 17/926,826

(22) PCT Filed: May 23, 2022

(86) PCT No.: PCT/CN2022/094515
§ 371 (c)(1),
(2) Date: Nov. 21, 2022

(87) PCT Pub. No.: WO2023/225807
PCT Pub. Date: Nov. 30, 2023

(65) Prior Publication Data
US 2024/0234435 A1 Jul. 11, 2024

(51) Int. Cl.
*H10D 86/60* (2025.01)
*G02F 1/1333* (2006.01)
(Continued)

(52) U.S. Cl.
CPC ....... *H10D 86/60* (2025.01); *G02F 1/133345* (2013.01); *G02F 1/133357* (2021.01);
(Continued)

(58) Field of Classification Search
CPC ............... G02F 1/1339; G02F 1/13394; G02F 1/13396; G02F 1/136286
See application file for complete search history.

(56) References Cited

U.S. PATENT DOCUMENTS

2010/0053529 A1 3/2010 Kanaya et al.
2010/0157229 A1* 6/2010 Sakurai ............ G02F 1/134363 349/141
(Continued)

FOREIGN PATENT DOCUMENTS

CN 102269897 A 12/2011
CN 202075531 U 12/2011
(Continued)

*Primary Examiner* — Lauren Nguyen
(74) *Attorney, Agent, or Firm* — WHDA, LLP

(57) ABSTRACT

An array substrate, a display panel and a display apparatus are disclosed. The array substrate includes: a base substrate; an array of thin film transistors disposed on a side of the base substrate, wherein the array of thin film transistors includes a semiconductor layer; and a common metal layer disposed on a side of the array of thin film transistors away from the base substrate. An orthographic projection of the common metal layer on the base substrate does not overlap with an orthographic projection of the semiconductor layer on the base substrate, the common metal layer includes a plurality of metal wires arranged in an intersecting manner, wherein at least one of the plurality of metal wires is provided with a gap, and the main spacing area is disposed at or close to a center of an orthographic projection of the gap on the base substrate.

10 Claims, 9 Drawing Sheets

(51) Int. Cl.

| | |
|---|---|
| ***G02F 1/1339*** | (2006.01) |
| ***G02F 1/1343*** | (2006.01) |
| ***G02F 1/1362*** | (2006.01) |
| ***G02F 1/1368*** | (2006.01) |
| ***H10D 86/40*** | (2025.01) |

(52) U.S. Cl.

CPC ........ *G02F 1/1339* (2013.01); *G02F 1/13394* (2013.01); *G02F 1/13396* (2021.01); *G02F 1/13439* (2013.01); *G02F 1/136286* (2013.01); *G02F 1/1368* (2013.01); *H10D 86/441* (2025.01)

(56) References Cited

U.S. PATENT DOCUMENTS

| | | | | |
|---|---|---|---|---|
| 2011/0263055 | A1* | 10/2011 | Ahn | G02F 1/13439 257/E33.012 |
| 2013/0321752 | A1* | 12/2013 | Asakawa | G02F 1/1337 349/128 |
| 2016/0238903 | A1* | 8/2016 | Morimoto | G02F 1/13394 |
| 2017/0192279 | A1* | 7/2017 | Maede | G02F 1/136286 |
| 2022/0137444 | A1 | 5/2022 | Morimoto et al. | |

FOREIGN PATENT DOCUMENTS

| | | | | |
|---|---|---|---|---|
| CN | 103913899 | A | 7/2014 | |
| CN | 104730777 | A | 6/2015 | |
| CN | 105892180 | A | 8/2016 | |
| CN | 112467364 | A | 3/2021 | |
| CN | 214375724 | U | 10/2021 | |
| KR | 10-2015-0057027 | * | 5/2015 | G02F 1/136 |
| KR | 20150057027 | A | 5/2015 | |

* cited by examiner

ARRAY SUBSTRATE, DISPLAY PANEL AND DISPLAY APPARATUS

TECHNICAL FIELD

The present disclosure relates to the technical field of displaying and, more particularly, to an array substrate, a display panel and a display apparatus.

BACKGROUND

A liquid crystal display panel generally includes a color filter substrate and an array substrate, with liquid crystals being encapsulated between the color filter substrate and the array substrate. In the related art, a thickness of a liquid crystal layer, that is, a cell thickness, is mainly supported by a spacer disposed between the color filter substrate and the array substrate.

SUMMARY

An array substrate is provided in the present disclosure, An array substrate configured for forming a display panel with a cell substrate and a plurality of spacers, wherein the array substrate includes a plurality of spacing areas, a surface of respective one of the spacing areas facing the cell substrate is configured to be abutted against or to be disposed oppositely to a surface of respective one of the spacers facing the array substrate, and the plurality of spacing areas including a main spacing area; the array substrate includes:

- a base substrate;
- an array of thin film transistors disposed on a side of the base substrate, wherein the array of thin film transistors includes a semiconductor layer; and
- a common metal layer disposed on a side of the array of thin film transistors away from the base substrate;
- wherein an orthographic projection of the common metal layer on the base substrate does not overlap with an orthographic projection of the semiconductor layer on the base substrate, the common metal layer includes a plurality of metal wires arranged in an intersecting manner, wherein at least one of the plurality of metal wires is provided with a gap, and the main spacing area is disposed at or close to a center of an orthographic projection of the gap on the base substrate.

In an optional embodiment, a minimum distance between the orthographic projection of the common metal layer on the base substrate and the spacing area is greater than or equal to a preset distance, the preset distance is a maximum offset distance of the spacer after the display panel is pressed.

In an optional embodiment, the plurality of spacing areas further include an auxiliary spacing area, and a minimum distance between the orthographic projection of the common metal layer on the base substrate and the main spacing area is greater than or equal to a minimum distance between the orthographic projection of the common metal layer on the base substrate and the auxiliary spacing area.

In an optional embodiment, the minimum distance between the orthographic projection of the common metal layer on the base substrate and the auxiliary spacing area is greater than or equal to 12.5 microns.

In an optional embodiment, the plurality of metal wires include a first metal wire and a second metal wire arranged in an intersecting manner, a hollowed hole is disposed at an intersection of the first metal wire and the second metal wire, and the auxiliary spacing area is located within a range of an orthographic projection of the hollowed hole on the base substrate.

In an optional embodiment, the plurality of metal wires include a third metal wire and a fourth metal wire arranged in an intersecting manner, a bent portion is disposed on the third metal wire and/or the fourth metal wire, and an orthographic projection of the bent portion on the base substrate partially surrounds the auxiliary spacing area.

In an optional embodiment, the minimum distance between the orthographic projection of the common metal layer on the base substrate and the main spacing area is greater than or equal to 25 microns.

In an optional embodiment, wherein the array substrate includes a plurality of pixel units arrayed along a row direction and along a column direction;

- the at least one metal wire includes a fifth metal wire extending along the row direction; and the plurality of metal wires include a plurality of sixth metal wires extending along the column direction; and
- when the minimum distance between the orthographic projection of the common metal layer on the base substrate and the main spacing area is greater than or equal to a first distance, a minimum distance between an orthographic projection of respective one of the sixth metal wires on the base substrate and the main spacing area in the row direction is greater than or equal to the first distance.

In an optional embodiment, wherein a distance between two of the plurality of sixth metal wires respectively adjacent to the main spacing area in the row direction is greater than or equal to a size of two pixel units in the row direction, and less than or equal to a size of three pixel units in the row direction.

In an optional embodiment, a size of a gap on the fifth metal wire in the row direction is equal to a size of two pixel units in the row direction.

In an optional embodiment, the array substrate includes a plurality of pixel units arrayed in a row direction and in a column direction, the pixel unit including two domain areas divided by a boundary line of domain areas;

- the at least one metal wire includes a seventh metal wire extending along the column direction; the plurality of metal wires include an eighth metal wire extending along the row direction;
- wherein an orthographic projection of the eighth metal wire on the base substrate is located at a position of the boundary line of domain areas in the pixel unit.

In an optional embodiment, a size of a gap on the seventh metal wire in the column direction is equal to a size of one pixel unit in the column direction.

In an optional embodiment, the array substrate includes a plurality of pixel units arrayed along a row direction and along a column direction;

- the at least one metal wire includes a ninth metal wire and a tenth metal wire, the ninth metal wire extending along the row direction and the tenth metal wire extending along the column direction; and
- a size of a gap on the ninth metal wire in the row direction is equal to a size of two pixel units in the row direction; a size of a gap on the tenth metal wire in the row direction is equal to a size of two pixel units in the column direction.

In an optional embodiment, wherein the array substrate further includes at least one of:

a first transparent electrode layer disposed on a surface of a side of the common metal layer away from the base substrate;

a planarization layer disposed between the array of thin film transistors and the common metal layer, wherein a material of the planarization layer is an organic insulating material;

a second transparent electrode layer disposed between the planarization layer and the common metal layer; and a first insulating layer disposed between the second transparent electrode layer and the common metal layer.

In an optional embodiment, the array substrate includes a plurality of pixel units arrayed along a row direction and along a column direction;

the array of thin film transistors further includes a grid line metal layer and a second insulating layer arranged in layer configuration on a side of the semiconductor layer close to the base substrate, the semiconductor layer is arranged on a side of the second insulating layer away from the base substrate, and the grid line metal layer includes a plurality of grid lines extending along the row direction;

the plurality of metal wires include a plurality of transverse metal wires extending along the row direction; and in the column direction, orthographic projections of the transverse metal wires on the base substrate is located within a range of orthographic projections of the grid lines on the base substrate, or the orthographic projections of the transverse metal wires on the base substrate covers the orthographic projections of the grid lines on the base substrate, or the orthographic projections of the transverse metal wires on the base substrate completely or partially overlaps with the orthographic projections of the grid lines on the base substrate.

In an optional embodiment, wherein the array substrate includes a plurality of pixel units arrayed in a row direction and in a column direction;

the array of thin film transistors further includes a data line metal layer disposed on a side of the semiconductor layer away from the base substrate, the data line metal layer including a plurality of data lines extending along the column direction;

the plurality of metal wires includes a plurality of vertical metal wires extending along the column direction, and each of vertical metal wires includes a plurality of metal wire segments, wherein the plurality of metal wire segments are parallel to the plurality of data lines; and in the row direction, orthographic projections of the metal wire segments on the base substrate is located within a range of orthographic projections of the data lines on the base substrate, or the orthographic projections of the metal wire segments on the base substrate covers the orthographic projections of the data lines on the base substrate, or the orthographic projections of the metal wire segment on the base substrate completely or partially overlaps with the orthographic projections of the data lines on the base substrate.

The present disclosure provides a display panel, including the cell substrate and the array substrate according to any one of the embodiments mentioned above, and a liquid crystal layer and a plurality of spacers disposed between the cell substrate and the array substrate;

wherein the plurality of spacers are arranged on a surface of a side of the cell substrate close to the array substrate, for supporting the cell substrate and the array substrate, the surface of the respective one of the spacers facing the array substrate is abutted against or disposed oppositely to the surface of the respective one of the spacing areas facing the cell substrate.

In an optional embodiment, the plurality of spacing areas include the main spacing area and an auxiliary spacing area;

the display panel includes a plurality of sub-pixels arrayed along a row direction and along a column direction, and the plurality of sub-pixels includes a first color sub-pixel, a second color sub-pixel, and a third color sub-pixel; and the plurality of metal wires includes a plurality of vertical metal wires extending along a column direction;

wherein the main spacing area is arranged in the third color sub-pixel; the vertical metal wires are located between the third color sub-pixel and the first color sub-pixel which are adjacently arranged in the row direction, and/or the vertical metal wires are located between the first color sub-pixel and the second color sub-pixel which are adjacently arranged along the row direction.

In an optional embodiment, the first color sub-pixel is a red sub-pixel, the second color sub-pixel is a green sub-pixel, and the third color sub-pixel is a blue sub-pixel.

The present disclosure provides a display apparatus, including the display panel according to any one of the embodiments mentioned above.

The above description is only a summary of technical schemes of the present disclosure, which can be implemented according to contents of the specification in order to better understand technical means of the present disclosure; and in order to make above and other objects, features and advantages of the present disclosure more obvious and understandable, detailed description of the present disclosure is particularly provided in the following.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work. It should be noted that the ratios in the drawings are merely illustrative and do not represent actual ratios.

DETAILED DESCRIPTION OF THE EMBODIMENTS

In order to make the objects, the technical solutions, and the advantages of the embodiments of the present disclosure clearer, the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
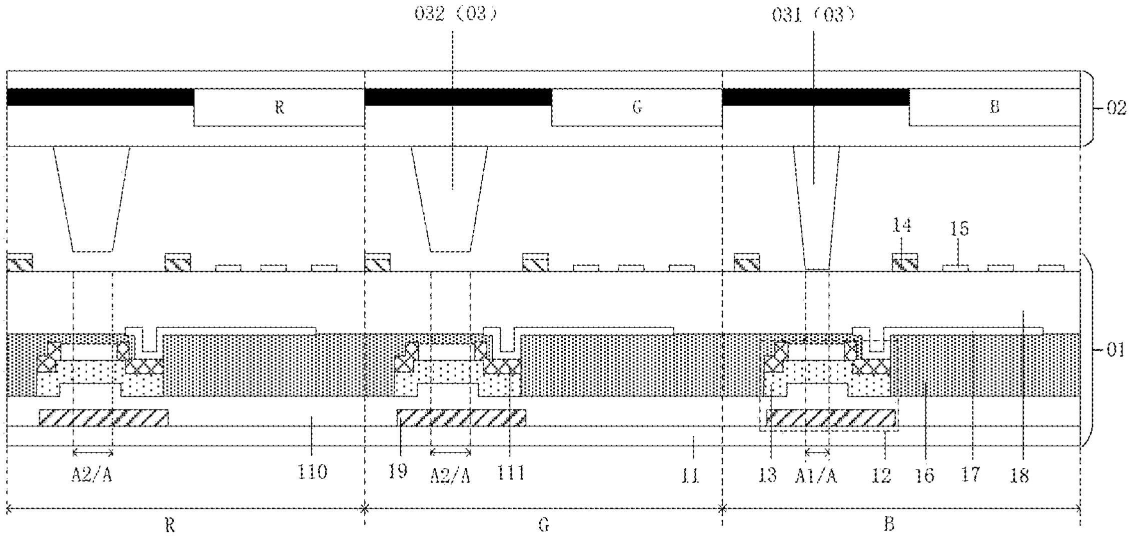
FIG. 1 (Prior Art)
FIG. 1 schematically shows a sectional structural diagram of a display panel in the related art.

An array substrate 01 is provided in the present disclosure, which is configured to form a display panel with a cell substrate 02 and a plurality of spacers 03. Reference is made to FIG. 1, which schematically shows a sectional structural diagram of a display panel using the array substrate according to the present disclosure. As shown in FIG. 1, the array substrate 01 includes a plurality of spacing areas A, and a surface of respective one of the spacing areas A facing the cell substrate 02 is configured to be abutted against or to be disposed oppositely to a surface of respective one of the spacers 03 facing the array substrate 01.

As shown in FIG. 1, the array substrate 01 includes a base substrate 11; An array of thin film transistors 12 disposed on one side of the base substrate 11, wherein the array of thin film transistors 12 includes a semiconductor layer 13; and a common metal layer 14 is disposed on the side of the array of thin film transistors 12 away from the base substrate 11.

An orthographic projection of the common metal layer 14 on the base substrate 11 does not overlap with an orthographic projection of the semiconductor layer 13 on the base substrate 11.

The inventor has found that when a distance between the orthographic projection of the common metal layer 14 on the base substrate 11 and the spacing area A is small and after the display panel is touched and pressed, the spacer 03 are displaced relative to the array substrate 01, and the spacer 03 can be caught by the common metal layer 14 and deform during the displacement, resulting in the spacer 03 not being able to quickly recover to their original state, and then the deformed spacer 03 drive the cell substrate 02 to deform, thus accumulating stress on a glass in the cell substrate 02. After the glass is stressed, it turns into a transmission medium with an anisotropic refractive index due to photoelastic effect, which causes some of lights that should not be transmitted out to be transmitted out, resulting in uneven display in a dark state.

To improve the uneven display in the dark state, referring to FIG. 1, a minimum distance between the orthographic projection of the common metal layer 14 on the base substrate 11 and the spacing area A may be greater than or equal to a preset distance. The preset distance is a maximum offset distance of the spacer 03 after the display panel is pressed.

A value of the preset distance can be determined according to offset distances of the spacer 03 measured after the display panel is pressed, which is not specifically limited in the present disclosure.

By setting the minimum distance between the orthographic projection of the common metal layer 14 on the base substrate 11 and the spacing area A to be greater than or equal to the preset distance, the preset distance being the maximum offset distance of the spacer 03 after the display panel is pressed, the spacer 03 can slide freely around within the preset distance when the display panel is subjected to an external force, which reduces probability for the common metal layer 14 catching the spacer 03, ensures that the spacer 03 can be quickly restored to its original state after being moved or deformed, and contributes to stress relief of the glass in the display panel, and promotes the display panel quickly restored to its original state, thereby eliminating the uneven display in the dark state caused by touching the display panel.

It should be noted that, the minimum distance between the orthographic projection of the common metal layer 14 on the base substrate 11 and the spacing area A can be increased as much as possible without affecting an aperture ratio, so that the probability of the common metal layer 14 catching the spacer 03 can be further reduced.

The array of thin film transistors 12 may include a plurality of thin film transistors 12 arranged in an array. By setting the orthographic projection of the common metal layer 14 on the base substrate 11 not to overlap with the orthographic projection of the semiconductor layer 13 on the base substrate 11, it is possible to prevent a voltage on the common metal layer 14 from affecting switching of the thin film transistors 12.

Optionally, as shown in FIG. 1, the array substrate may further include a first transparent electrode layer 15 disposed on a surface of the common metal layer 14 away from the base substrate 11. That is, the first transparent electrode layer 15 is in direct contact with the surface of a side of the common metal layer 14 away from the base substrate 11.

In a specific implementation, a material of the common metal layer 14 may be metal. A material of the first transparent electrode layer 15 may be a transparent metal oxide such as indium tin oxide. Because of a low resistivity of metal, by setting the common metal layer 14 in direct contact with the first transparent electrode layer 15, resistance of a whole connection structure between the common metal layer 14 and the first transparent electrode layer 15 can be reduced, and voltage uniformity on the first transparent electrode layer 15 can be improved.

In addition, compared with a mode in the related art in which the common metal layer is arranged in a grid line layer and the common metal layer is connected with the first transparent electrode layer through a via hole, since the common metal layer 14 is in direct contact with the first transparent electrode layer 15, the aperture ratio can be increased.

Optionally, as shown in FIG. 1, the array substrate may further include a planarization layer 16 disposed between the array of thin film transistors 12 and the common metal layer 14.

The planarization layer 16 serves to planarize a surface of the array substrate. In addition, the planarization layer 16 is provided to further increase a distance between a metal layer in the array of thin film transistors 12 and the first transparent electrode layer 15, reduce coupling capacitance between the metal layer and the first transparent electrode layer, and reduce signal crosstalk, thus improving display effect.

With the common metal layer 14 being located on a side of the planarization layer 16 away from the base substrate 11, that is, the common metal layer 14 being farther away from the base substrate 11 than the planarization layer 16, and the planarization layer 16 being prepared before the common metal layer 14 in an actual preparation process, level difference of an edge of a surface of the common metal layer 14 cannot be leveled by the planarization layer 16, which makes it more difficult for the spacer 03 to pass over the level difference to recover to its original state after bending.

In addition, with the first transparent electrode layer 15 being disposed on the surface of a side of the common metal layer 14 away from the base substrate 11, overlapping between the first transparent electrode layer 15 and the common metal layer 14 further aggravates the level difference of the edge, further reducing probability of the spacer 03 passing over the level difference to recover to its original state after bending.

In this case, by setting the minimum distance between the orthographic projection of the common metal layer 14 on the base substrate 11 and the spacing area A to be greater than or equal to the preset distance, the uneven display in the dark state caused by touching the display panel can be more significantly improved.

A material of the planarization layer 16 may be an organic insulating material, which is not limited in the present disclosure.

Referring to FIG. 1, the array substrate 01 may further include a second transparent electrode layer 17 disposed between the planarization layer 16 and the common metal layer 14. The second transparent electrode layer 17 may include a plurality of pixel electrodes, and the plurality of pixel electrodes are connected with the thin film transistors 12 through via holes disposed on the planarization layer 16.

Optionally, the orthographic projection of the common metal layer 14 on the base substrate 11 does not overlap with orthographic projections of the via holes on the base substrate 11. In this way, coupling capacitance between the common metal layer 14 and the second transparent electrode layer 17 or coupling capacitance between a source electrode and a drain electrode of the thin film transistor 12 can be reduced, the signal crosstalk can be reduced, and the display effect can be improved.

Referring to FIG. 1, the array substrate 01 may further include a first insulating layer 18 disposed between the second transparent electrode layer 17 and the common metal layer 14.

As shown in FIG. 1, the plurality of spacing areas A may include a main spacing area A1 and an auxiliary spacing area A2. Accordingly, the plurality of spacers 03 include a main spacer 031 and an auxiliary spacer 032. A surface of the main spacing area A1 facing the cell substrate 02 is configured to be abutted against a surface of the main spacer 031 facing the array substrate 01, and a surface of the auxiliary spacing area A2 facing the cell substrate 02 is configured to be disposed oppositely to a surface of the auxiliary spacer 032 facing the array substrate 01.

In a specific implementation, a minimum distance between the orthographic projection of the common metal layer 14 on the base substrate 11 and the main spacing area A1 is greater than or equal to the preset distance, and a minimum distance between the orthographic projection of the common metal layer 14 on the base substrate 11 and the auxiliary spacing area A2 is greater than or equal to the preset distance.

Illustratively, after the display panel is pressed, a measured maximum offset distance of the spacer 03 is 12.5 microns, that is, the preset distance can be 12.5 microns. Accordingly, a minimum distance between the orthographic projection of the common metal layer 14 on the base substrate 11 and the auxiliary spacing area A2 is greater than or equal to 12.5 microns.

Figure 2:
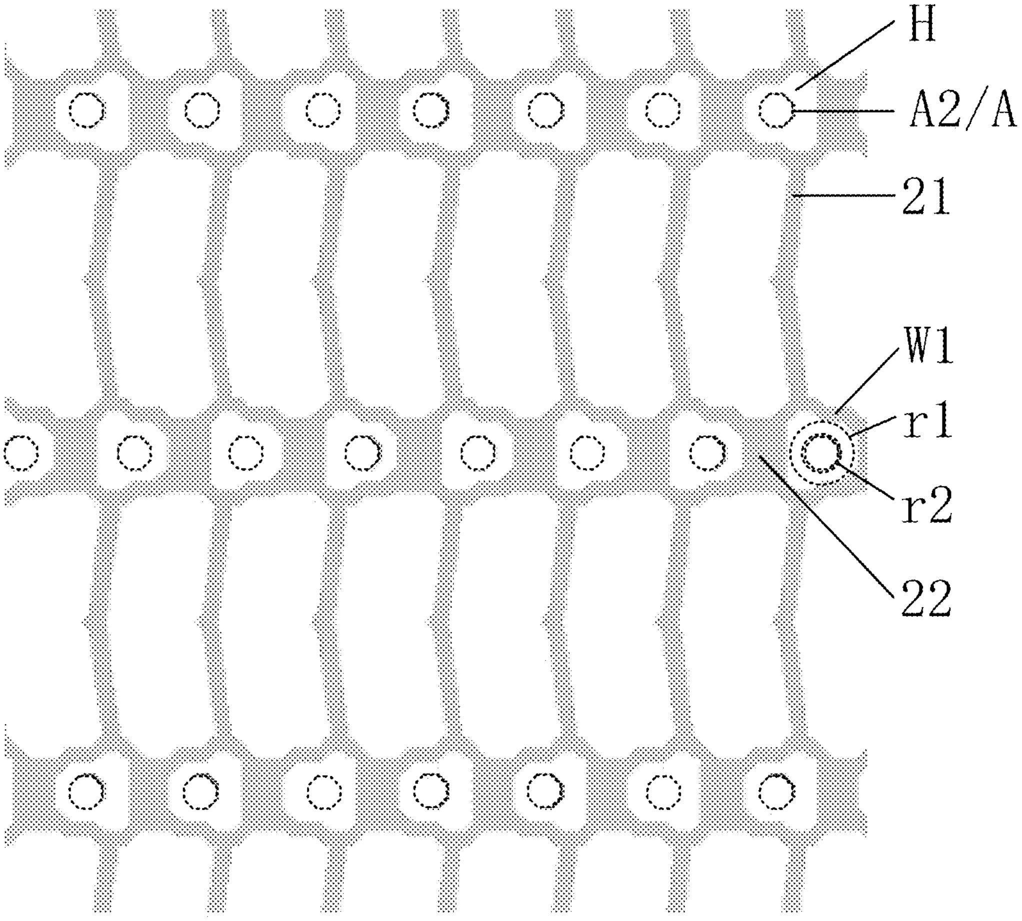
FIG. 2 schematically shows a schematic diagram showing the planar structure of first array substrate according to the present disclosure.

In order to realize that the minimum distance between the orthographic projection of the common metal layer 14 on the base substrate 11 and the auxiliary spacing area A2 is greater than or equal to the preset distance, in the first implementation, as shown in FIG. 2, a plurality of metal wires in the common metal layer 14 include a first metal wire 21 and a second metal wire 22 which are arranged in an intersecting manner, and a hollowed hole H is disposed at an intersection of the first metal wire 21 and the second metal wire 22, and the auxiliary spacing area A2 is located within a range of an orthographic projection of the hollowed hole H on the base substrate 11.

In the implementation, there is a closing structure W1 at the intersection of the first metal wire 21 and the second metal wire 22, which is located around the hollowed hole H. An orthographic projection of the closing structure W1 on the base substrate 11 completely surrounds the auxiliary spacing area A2.

As shown in FIG. 2, a minimum distance between the orthographic projection of the closing structure W1 on the base substrate 11 and the auxiliary spacing area A2 is greater than or equal to the preset distance. That is, difference between a radius r1 of a smallest inscribed circle of the closing structure W1 and a radius r2 of a largest circumscribed circle of the auxiliary spacing area A2 is greater than or equal to the preset distance.

In a specific implementation, a spacing area A can be located within a range of an orthographic projection of a thin film transistor 12 on the base substrate 11, so that influence of the spacer on the aperture ratio can be reduced. In addition, with the orthographic projection of the common metal layer 14 on the base substrate 11 not overlapping with the orthographic projection of the semiconductor layer 13 on the base substrate 11, in this case, the orthographic projection of the closing structure W1 on the base substrate 11 can surround the orthographic projection of the thin film transistor 12 on the base substrate 11.

Figure 3:
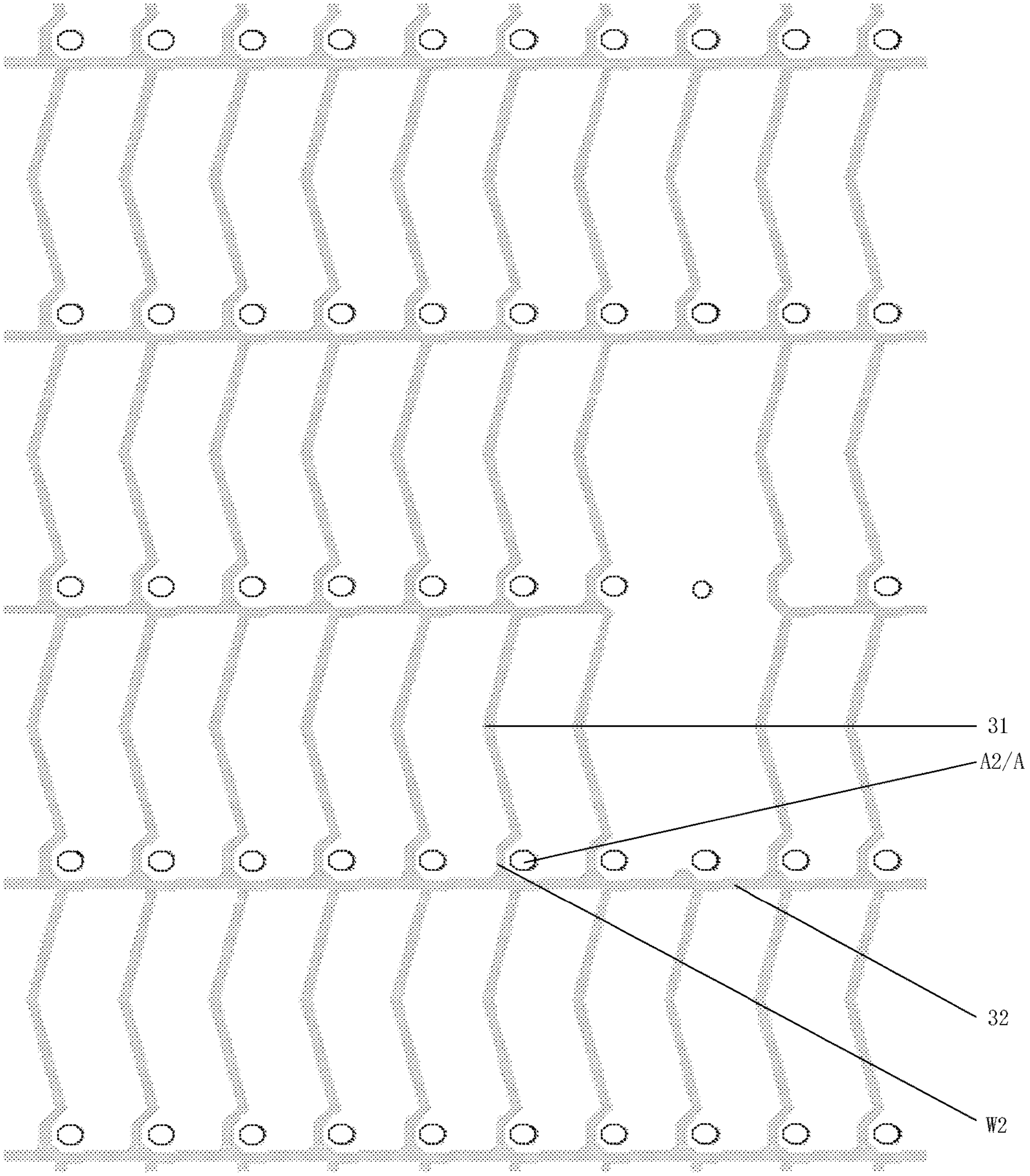
FIG. 3 schematically shows a schematic diagram showing the planar structure of second array substrate according to the present disclosure.

In a second implementation, as shown in FIG. 3, a plurality of metal wires in the common metal layer 14 include a third metal wire 31 and a fourth metal wire 32 arranged in an intersecting manner, a bent portion W2 is disposed on the third metal wire 31 and/or the fourth metal wire 32, and an orthographic projection of the bent portion W2 on the base substrate 11 partially surrounds the auxiliary spacing area A2.

The bent portion W2 may be disposed on the third metal wire 31, or on the fourth metal wire 32, or on both the third metal wire 31 and the fourth metal wire 32, which is not limited in the present disclosure.

In this implementation, the bent portion W2 is located at a periphery of the auxiliary spacing area A2 and protrudes toward a side away from the auxiliary spacing area A2, ensuring that a minimum distance between an orthographic projection of the bent portion W2 surrounding the auxiliary spacing area A2 on the base substrate 11 and the auxiliary spacing area A2 is greater than or equal to the preset distance.

In the first implementation, since the closing structure W1 completely surrounds the auxiliary spacing area A2, the auxiliary spacer 032 may be blocked or caught during sliding in various directions. In the second implementation, because the orthographic projection of the bent portion W2 on the base substrate 11 partly surrounds the auxiliary spacing area A2, the auxiliary spacer 032 is blocked only during sliding in some of the directions, but can slide freely in other directions, which further reduces probability of the auxiliary spacer 032 being caught, facilitates quick recovering of the auxiliary spacer 032 to its original state, and improves the uneven display in the dark state caused by touching the display panel.

Optionally, the minimum distance between the orthographic projection of the common metal layer 14 on the base substrate 11 and the main spacing area A1 may be equal to the minimum distance between the orthographic projection of the common metal layer 14 on the base substrate 11 and the auxiliary spacing area A2.

As shown in FIG. 1, in a normal direction of the base substrate 11, a thickness of the main spacer 031 is generally larger than that of the auxiliary spacer 032, and there is a great risk that the main spacer 031 will get caught during the process of pressing the display panel.

To reduce a risk of the main spacer 031 getting caught, optionally, the minimum distance between the orthographic projection of the common metal layer 14 on the base substrate 11 and the main spacing area A1 is larger than the minimum distance between the orthographic projection of the common metal layer 14 on the base substrate 11 and the auxiliary spacing area A2.

In this case, the minimum distance between the orthographic projection of the common metal layer 14 on the base substrate 11 and the main spacing area A1 may be greater than or equal to a first distance, and the minimum distance between the orthographic projection of the common metal layer 14 on the base substrate 11 and the auxiliary spacing area A2 is greater than or equal to the preset distance. The first distance is larger than the preset distance.

Illustratively, the first distance may be twice the preset distance. When the preset distance is 12.5 microns, the first distance may be 25 microns. That is, the minimum distance between the orthographic projection of the common metal layer 14 on the base substrate 11 and the main spacing area A1 is greater than or equal to 25 microns.

In order to realize that the minimum distance between the orthographic projection of the common metal layer 14 on the base substrate 11 and the main spacing area A1 is greater than or equal to the preset distance or the first distance, optionally, as shown in FIGS. 4 to 9, the common metal layer 14 includes a plurality of metal wires arranged in an intersecting manner, and at least one of the plurality of metal wires is a discontinuous metal wire which is provided with a gap, and the main spacing area A1 is disposed at or close to a center of an orthographic projection of the gap on the base substrate 11.

As shown in FIGS. 4 to 9, the at least one metal wire is broken at a periphery of the main spacing area A1, a gap giving way to the main spacer 031 is formed, and a pattern around the main spacer 031 that might block the main spacer 031 from sliding is removed. The main spacing area A1 is located at or close to the center of the orthographic projection of the gap on the base substrate 11, thus ensuring that the main spacer 031 can slide freely when the display panel is subjected to an external force. Ensuring that the main spacer 031 will not be blocked during sliding and the main spacer 031 is protected from being caught, and facilitates quick recovering of the main spacer 031 to its original state and improves the uneven display in dark state caused by touching the display panel.

In a specific implementation, as shown in FIGS. 4 to 9, the array substrate 01 may include a plurality of pixel units P arrayed along a row direction and along a column direction. Each of the pixel units P may be formed by intersecting a plurality of grid lines extending along the row direction and a plurality of data lines extending along the column direction.

In a specific implementation, there are many ways to realize a specific structure of the common metal layer 14.

Figure 4:
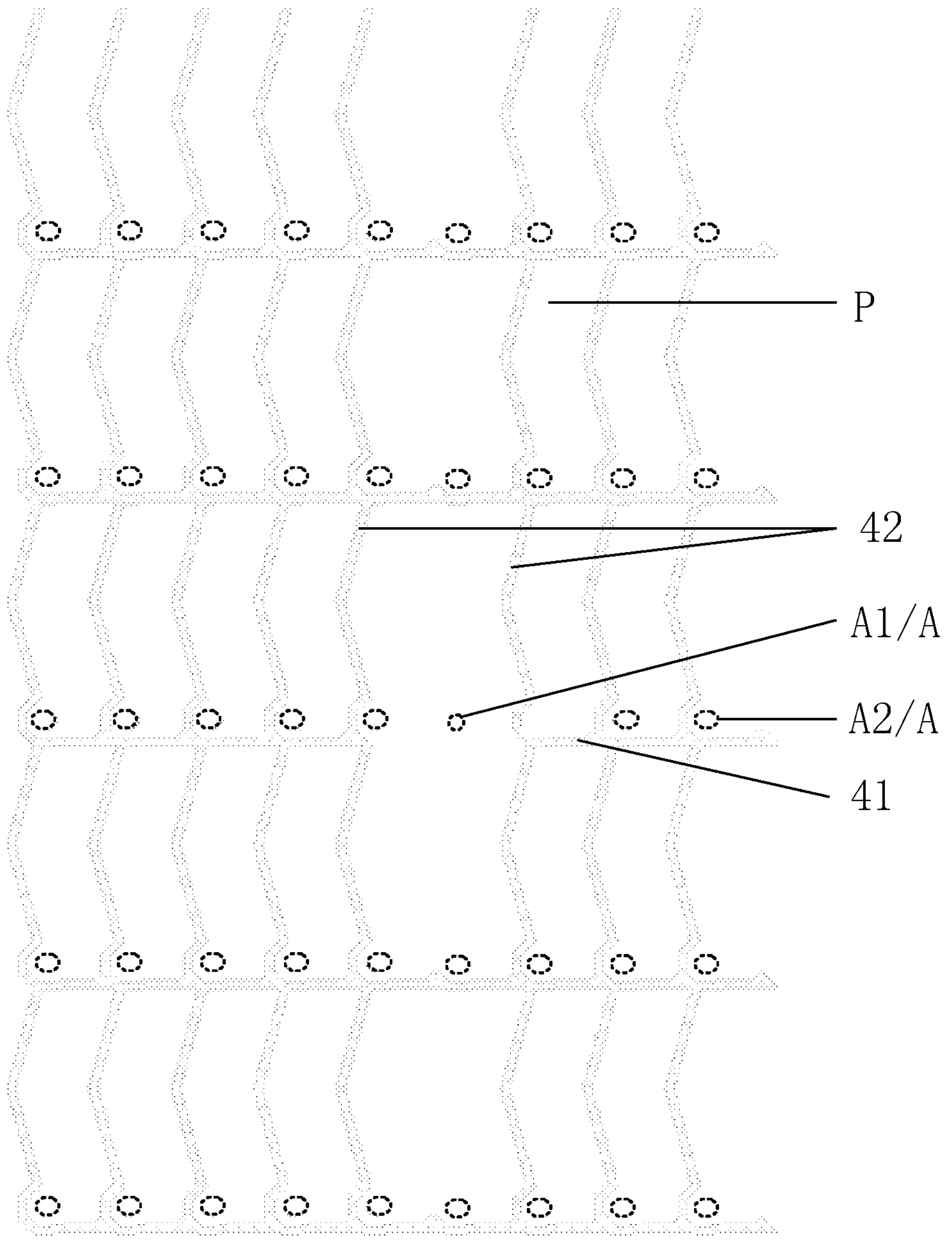
FIG. 4 schematically shows a schematic diagram showing the planar structure of third array substrate according to the present disclosure.
Figure 5:
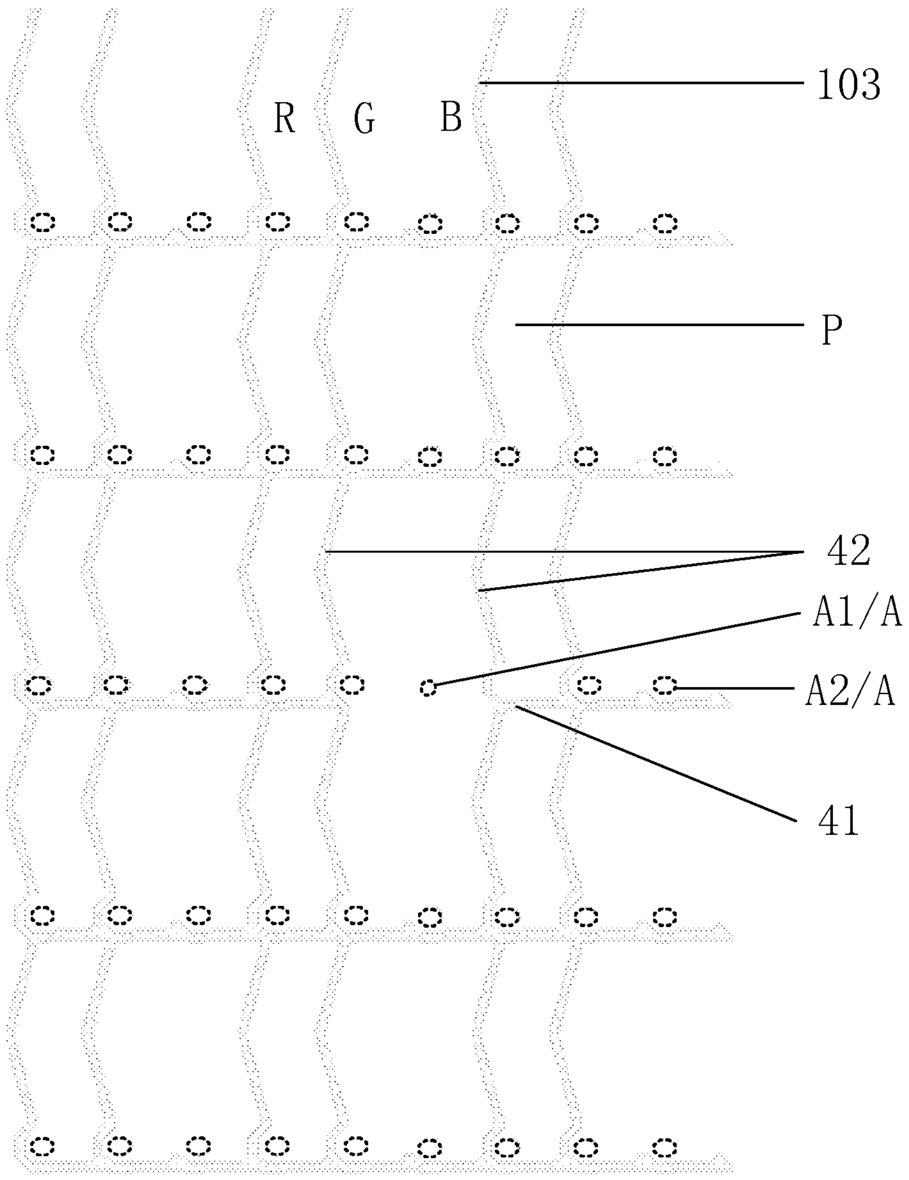
FIG. 5 schematically shows a schematic diagram showing the planar structure of fourth array substrate according to the present disclosure.
Figure 6:
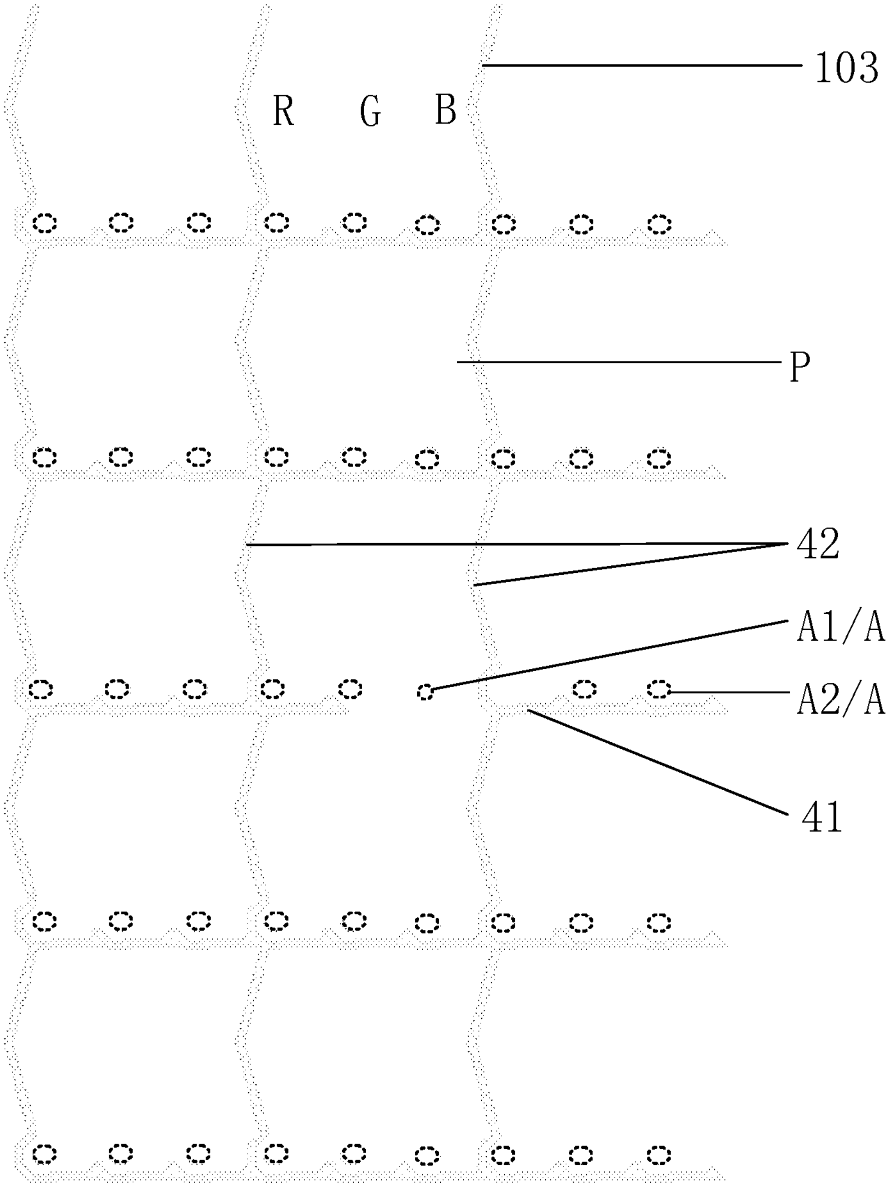
FIG. 6 schematically shows a schematic diagram showing the planar structure of fifth array substrate according to the present disclosure.

In a first alternative implementation, as shown in FIGS. 4 to 6, the at least one metal wire includes a fifth metal wire 41, that is, the fifth metal wire 41 is a discontinuous metal wire, and the fifth metal wire 41 extends along the row direction. The plurality of metal wires includes a plurality of sixth metal wires 42, and the sixth metal wires 42 extend along the column direction.

In the implementation, if the minimum distance between the orthographic projection of the common metal layer 14 on the base substrate 11 and the main spacing area A1 is greater than or equal to the first distance, a minimum distance between an orthographic projection of respective one of the sixth metal wires 42 on the base substrate 11 and the main spacing area A1 in the row direction is greater than or equal to the first distance.

As shown in FIGS. 4 to 6, one of the sixth metal wires 42 which is more close to the main spacing area A1 in the row direction is absent. In this way, it is possible to ensure that the spacing areas A located in a same row as the main spacing area A1 can freely slide in a wider range in the row direction, thus reducing probability of a spacer 03 corresponding to this row of spacing areas A being caught when sliding in the row direction, facilitating quick recovering of the spacer 03 in this row to its original state, and improving the uneven display in the dark state caused by touching the display panel.

Optionally, as shown in FIGS. 4 to 6, a distance between two of the plurality of sixth metal wires 42 respectively adjacent to the main spacing area A1 in the row direction is greater than or equal to a size of two pixel units P in the row direction, and less than or equal to a size of three pixel units P in the row direction.

The two sixth metal wires 42 are located on two sides of the main spacing area A1 respectively, and are adjacent to the main spacing area A1 in the row direction respectively.

As shown in FIGS. 4 and 5, the distance between the two sixth metal wires 42 adjacent to the main spacing area A1 in the row direction is equal to the size of two pixel units P in the row direction.

As shown in FIG. 6, the distance between the two sixth metal wires 42 adjacent to the main spacing area A1 in the row direction is equal to the size of three pixel units P in the row direction.

Optionally, as shown in FIGS. 4 to 6, a size of a gap on the fifth metal wire 41 along the row direction is equal to the size of two pixel units P along the row direction.

In FIG. 4 and FIG. 5, two end points of the fifth metal wire 41 close to the main spacing area A1 are respectively located on the two sixth metal wires 42 adjacent to the main spacing area A1. The two sixth metal wires 42 are located on two sides of the main spacing area A1 respectively, and are adjacent to the main spacing area A1 in the row direction respectively.

When the two end points of the fifth metal wire 41 close to the main spacing area A1 are located in the two sixth metal wires 42 described above, there is no tip raised on sides of the two sixth metal wires 42 close to the main spacing area A1, thereby preventing tip discharge and further improving display uniformity.

In a structure shown in FIG. 6, the size of the gap on the fifth metal wire 41 in the row direction can also be equal to the size of the three pixel units P in the row direction, and the two end points of the fifth metal wire 41 close to the main spacing area A1 are respectively located on the two sixth metal wires 42 adjacent to the main spacing area A1, and it can be ensured that there is no tip raised on sides, close to the main spacing area A1, of the two sixth metal wires 42 adjacent to the main spacing area A1, thereby preventing the tip discharge and further improving the display uniformity.

Figure 7:
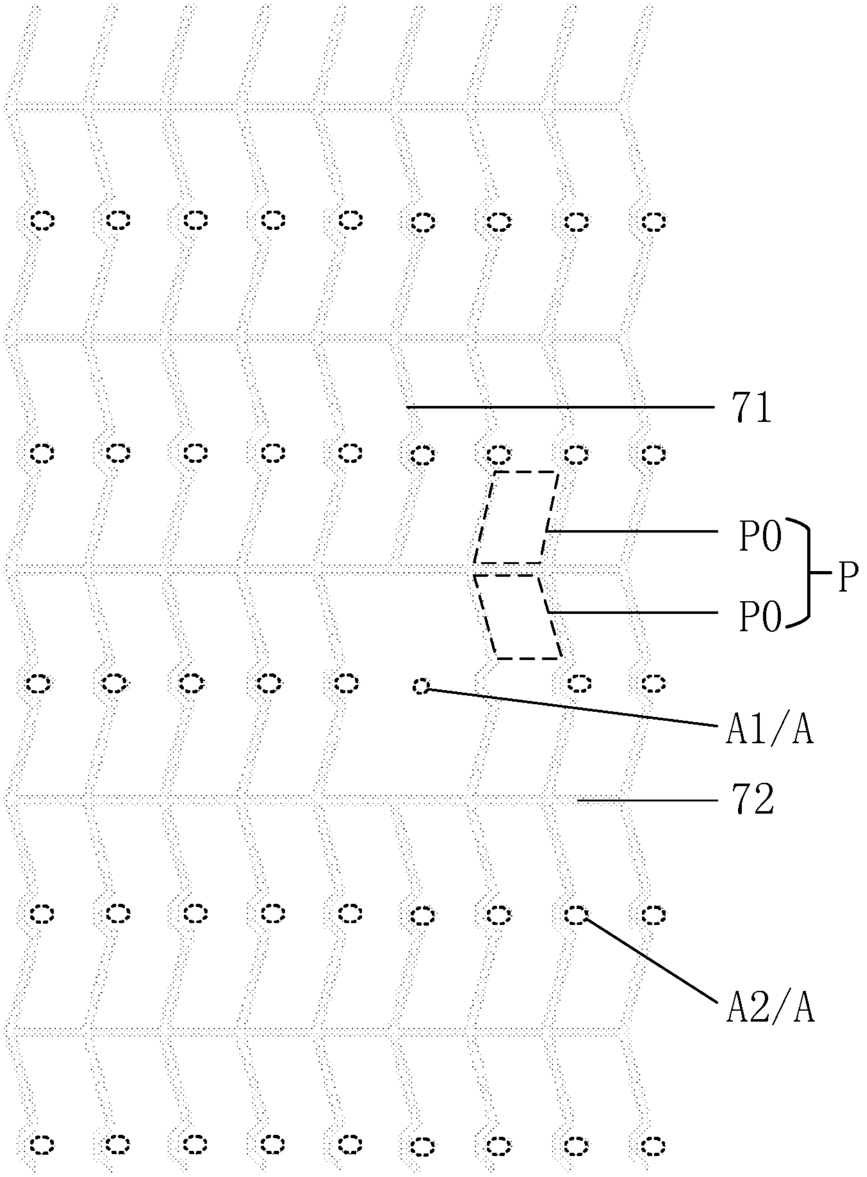
FIG. 7 schematically shows a schematic diagram showing the planar structure of sixth array substrate according to the present disclosure.

In a second alternative implementation, as shown in FIG. 7, a respective pixel unit p includes two domain areas PO divided by a boundary line. The at least one metal wire includes a seventh metal wire 71, that is, the seventh metal wire 71 is a discontinuous metal wire, and the seventh metal wire 71 extends along the column direction. The plurality of metal wires include an eighth metal wire 72 which extends along the row direction.

An orthographic projection of the eighth metal wire 72 on the base substrate 11 is located at a boundary line of domain areas in the pixel unit.

In FIGS. 2 to 6, and FIGS. 8 and 9, the metal wires extending along the row direction are located at the grid lines. In this case, it is necessary to provide a black matrix at the grid lines to shield the metal wires, resulting in a decrease in the aperture ratio. In this implementation, since the eighth metal wire 72 is located at the boundary line between the domain areas in the pixel unit, a size of the black matrix at the grid line can be reduced, thereby increasing the aperture ratio. In addition, since a junction of the domain areas PO is a dark region with low light efficiency, a light efficiency loss can be reduced by arranging the eighth metal wire 72 extending along the row direction at the junction of the domain areas.

Optionally, as shown in FIG. 7, a size of a gap on the seventh metal wire 71 along the column direction is equal to a size of one pixel unit p along the column direction.

As shown in FIG. 7, two end points of the seventh metal wire 71 close to the main spacing area A1 are respectively located on two eighth metal wires 72 adjacent to the main spacing area A1 in the column direction. The two eighth metal wires 72 are located on two sides of the main spacing area A1, and are adjacent to the main spacing area A1 in the column direction.

When the two end points of the seventh metal wire 71 close to the main spacing area A1 are located in the two eighth metal wires 72 described above, there is no tip raised on sides of the two eighth metal wires 72 close to the main spacing area A1, thereby preventing the tip discharge and further improving the display uniformity.

Figure 8:
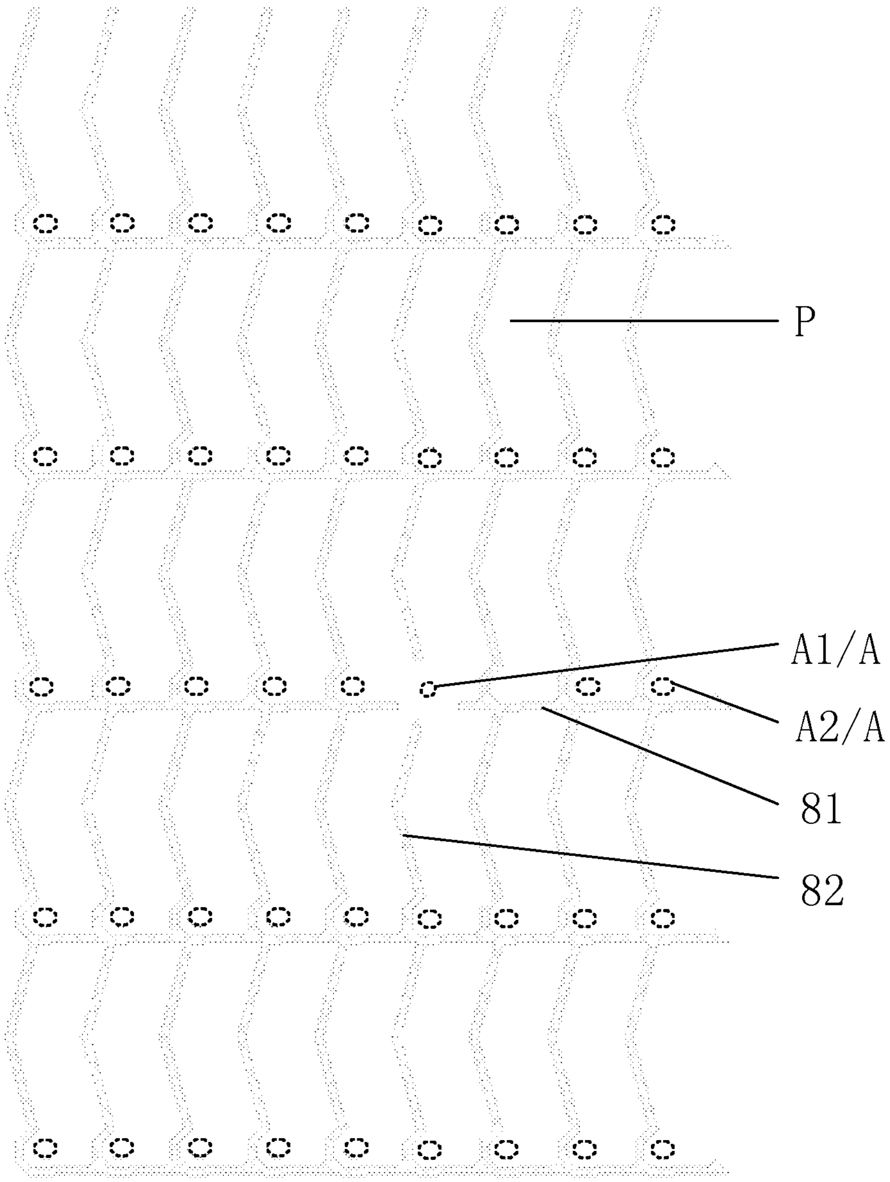
FIG. 8 schematically shows a schematic diagram showing the planar structure of seventh array substrate according to the present disclosure.
Figure 9:
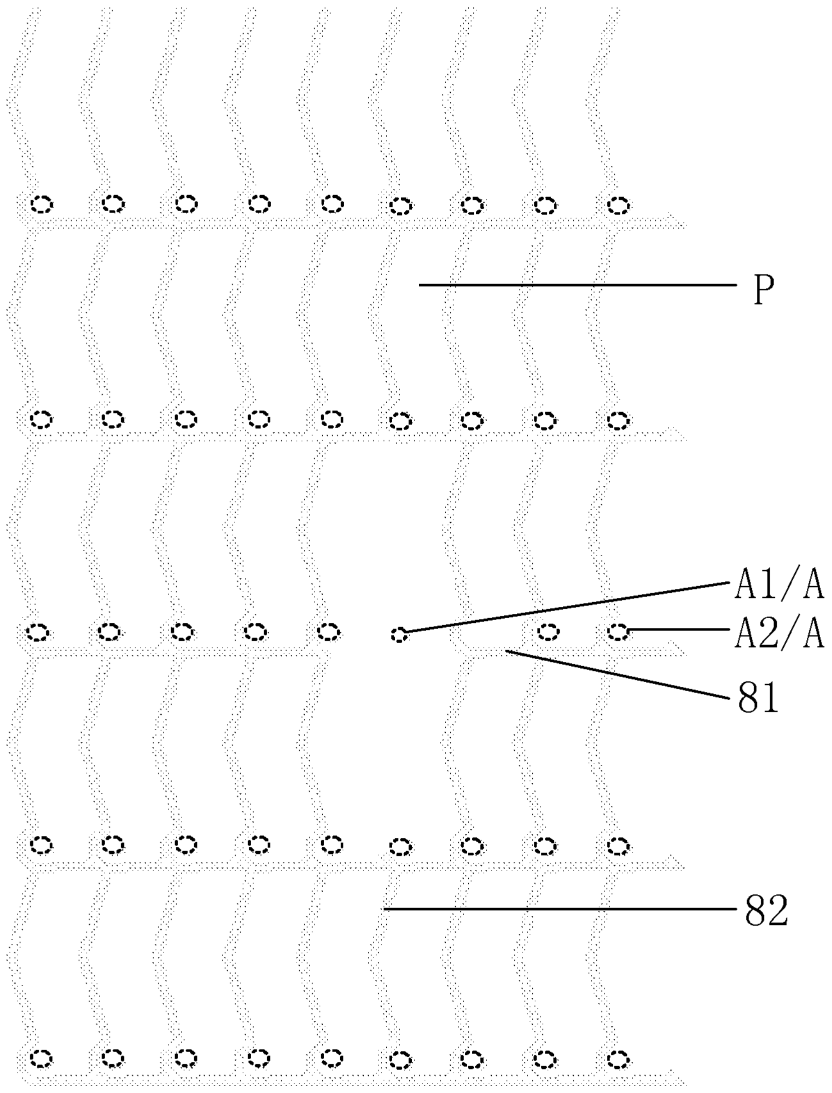
FIG. 9 schematically shows a schematic diagram showing the planar structure of eighth array substrate according to the present disclosure.

In a third alternative implementation, as shown in FIGS. 8 and 9, the at least one metal wire includes a ninth metal wire 81 and a tenth metal wire 82, that is, both the ninth metal wire 81 and the tenth metal wire 82 are discontinuous metal wires, with the ninth metal wire 81 extending along the row direction and the tenth metal wire 82 extending along the column direction.

In the implementation, metal on the ninth metal wire 81 and the tenth metal wire 82 close to the main spacing area A1 is removed to form a gap, which not only ensures that the main spacer 031 can slide freely under the external force, but also ensures that an area of the common metal wire is large enough, which facilitates improving voltage uniformity in the first transparent electrode layer 15.

A size of a gap on the ninth metal wire 81 in the row direction may be greater than or equal to the first distance; and a size of a gap on the tenth metal wire 82 in the column direction may be greater than or equal to the first distance.

Illustratively, as shown in FIG. 8, the size of the gap on the ninth metal wire 81 in the row direction is equal to the first distance. The size of the gap on the tenth metal wire 82 in the column direction may be equal to the first distance. In this way, the area of the common metal layer 14 can be maximized, resistance of the whole connection structure between the common metal layer 14 and the first transparent electrode layer 15 can be reduced, and uniformity of a common voltage on the first transparent electrode can be improved.

Illustratively, as shown in FIG. 9, the size of the gap on the ninth metal wire 81 in the row direction is equal to the size of two pixel units P in the row direction. In this way, a free sliding range of the main spacer 031 in the row direction can be further increased.

In addition, the size of the gap on the tenth metal wire 82 in the column direction is equal to a size of two pixel units P in the column direction. In this way, a free sliding range of the main spacer 031 in the column direction can be further increased.

In FIG. 9, two end points of the ninth metal wire 81 close to the main spacing area A1 are respectively located on two vertical metal wires adjacent to the main spacing area A1, and there is no tip raised on sides, close to the main spacing area A1, of the two vertical metal wires adjacent to the main spacing area A1, thus preventing the tip discharge and further improving the display uniformity.

In FIG. 9, two end points of the tenth metal wire 82 close to the main spacing area A1 are respectively located on two transverse metal wires adjacent to the main spacing area A1, and there is no tip raised on sides, close to the main spacing area A1, of the two transverse metal wires adjacent to the main spacing area A1, thus preventing the tip discharge and further improving the display uniformity.

Optionally, as shown in FIGS. 4 to 9, the spacing area A adjacent to the main spacing area A1 in the row direction or column direction may be the auxiliary spacing area A2. In this way, it can be avoided that the main spacing area A1 is densely arranged locally, which improves distribution uniformity of the main spacer and thus cell thickness uniformity of the display panel.

Figure 10:
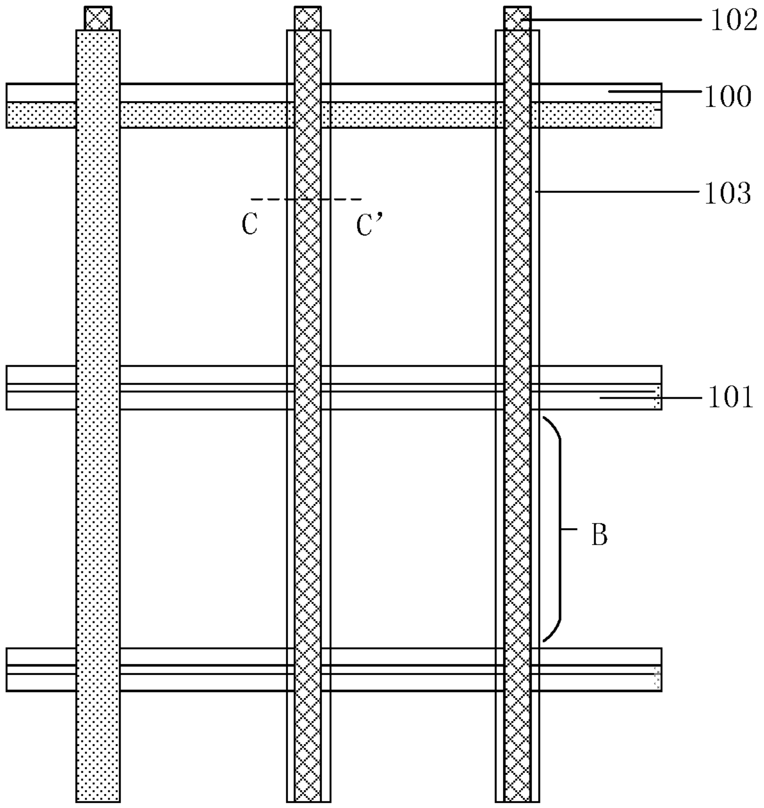
FIG. 10 schematically shows a schematic diagram showing the planar structure of ninth array substrate according to the present disclosure.

Referring to FIGS. 1 and 10, the array of thin film transistors 12 further includes a grid line metal layer 19 and a second insulating layer 110 arranged in layer configuration on a side of the semiconductor layer 13 close to the base substrate 11, and the semiconductor layer 13 is arranged on a side of the second insulating layer 110 away from the base substrate 11.

As shown in FIG. 10, the grid line metal layer 19 includes a plurality of grid lines 100 extending along the row direction. The plurality of metal wires in the common metal layer 14 include a plurality of transverse metal wires 101 extending along the row direction.

Optionally, an orthographic projection of a transverse metal wire 101 on the base substrate 11 is located within a range of an orthographic projection of a grid line 100 on the base substrate 11 in the column direction. In this case, a size of the grid line 100 is larger than that of the transverse metal wire 101 in the column direction, and in this way, influence of the transverse metal wire 101 on the aperture ratio can be reduced.

Optionally, the orthographic projection of the transverse metal wire 101 on the base substrate 11 covers the orthographic projection of the grid line 100 on the base substrate 11 in the column direction. In this case, the size of the grid line 100 is smaller than that of the transverse metal wire 101 in the column direction, and in this way, aperture ratios of pixel units P can be adjusted using the size of the transverse metal wire 101 in the column direction, and a display color of the display panel can be adjusted. At the same time, the transverse metal wire 101 is wide, which can reduce overall resistance of the connection structure between the common metal layer 14 and the first transparent electrode layer 15 and improve the uniformity of the common voltage on the first transparent electrode layer 15.

Optionally, the orthographic projection of the transverse metal wire 101 on the base substrate 11 completely overlaps with the orthographic projection of the grid line 100 on the base substrate 11 in the column direction. In this case, a size of the grid line 100 is equal to that of the transverse metal wire 101 in the column direction, and in this way, the influence of the transverse metal wire 101 on the aperture ratio can be reduced.

Optionally, the orthographic projection of the transverse metal wire 101 on the base substrate 11 partially overlaps with the orthographic projection of the grid line 100 on the base substrate 11 in the column direction, as shown in FIG. 10. In this case, overlapping between the transverse metal wire 101 and the grid line 100 in the column direction is reduced, which can reduce coupling capacitance between the grid line 100 and the transverse metal wire and prevent crosstalk between a grid line signal and a common voltage signal on the transverse metal wire 101.

Optionally, the orthographic projection of the transverse metal wire 101 on the base substrate 11 does not overlap with the orthographic projection of the grid line 100 on the base substrate 11 in the column direction. Since the transverse metal wires 101 does not overlap with the grid lines 100 in the column direction, the coupling capacitance between the grid lines 100 and the transverse metal wires is further reduced, and the crosstalk between the grid line signal and the common voltage signal on the transverse metal wire 101 is further prevented.

Referring to FIGS. 1 and 10, the array of thin film transistors 12 further includes a data line metal layer 111 disposed on a side of the semiconductor layer 13 away from the base substrate 11.

As shown in FIG. 1, the planarization layer 16, the second transparent electrode layer 17 and the first insulating layer 18 may be sequentially arranged in layer configuration on a side of the data line metal layer 111 away from the base substrate 11. The planarization layer 16 is located between the data line metal layer 111 and the second transparent electrode layer 17.

Referring to FIG. 10, the data line metal layer 111 includes a plurality of data lines 102 extending along the column direction. The plurality of metal wires in the common metal layer 14 include a plurality of vertical metal wires 103 extending along the column direction.

The vertical metal wires 103 includes a plurality of metal wire segments B, and the metal wire segments B are parallel to the data lines 102. When the vertical metal wire 103 is provided with a bent portion W2 or a closing structure W1, the metal wire segment B is connected between two adjacent bent portions W2 or closing structures W1 in the column direction.

Optionally, an orthographic projection of a metal wire segment B on the base substrate 11 is located within a range of an orthographic projection of a data line 102 on the base substrate 11 in the row direction. In this case, the size of the data line 102 is larger than that of the metal wire segment B in the row direction, which can reduce influence of the metal wire segment B on the aperture ratio.

Figure 11:
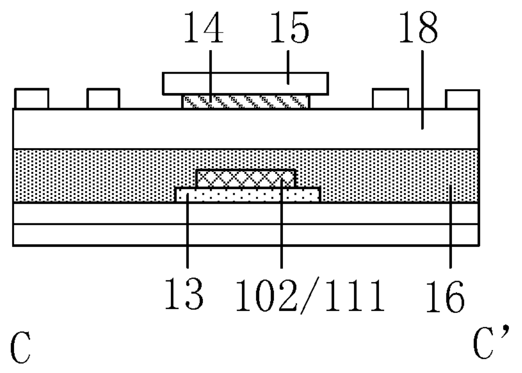
FIG. 11 schematically shows a sectional structural diagram of the ninth array substrate according to the present disclosure.

Optionally, the orthographic projection of the metal wire segment B on the base substrate 11 covers the orthographic projection of the data line 102 on the base substrate 11 in the row direction, as shown in FIGS. 10 and 11. In this case, the size of the data line 102 is smaller than the size of the metal wire segment B in the row direction, so that the aperture ratio of the respective pixel unit P can be adjusted using the size of the metal wire segment B in the row direction, and the display color of the display panel can be adjusted. FIG. 11 shows a schematic cross-sectional structural diagram at a position CC' in FIG. 10.

Optionally, the orthographic projection of the metal wire segment B on the base substrate 11 completely overlaps with the orthographic projection of the data line 102 on the base substrate 11 in the row direction. In this case, the size of the data line 102 is equal to that of the metal wire segment B in the row direction, which can reduce influence of the metal wire segment B on the aperture ratio.

Optionally, the orthographic projection of the metal wire segment B on the base substrate 11 partially overlaps with the orthographic projection of the data line 102 on the base substrate 11 in the row direction. In this case, overlapping between the metal wire segment B and the data line 102 in the row direction is reduced, which can reduce coupling capacitance between the data line 102 and the metal wire segment B and prevent crosstalk between a data line 102 signal and a common voltage signal on the metal wire segment B.

Optionally, the orthographic projection of the metal wire segment B on the base substrate 11 does not overlap with the orthographic projection of the data line 102 on the base substrate 11 in the row direction. Since the metal wire segment B does not overlap with the data line 102 in the row direction, coupling capacitance between the data line 102 and the metal wire segment B is further reduced, and the crosstalk between the data line 102 signal and the common voltage signal on the metal wire segment B is prevented.

A display panel is provided in the present disclosure. Referring to FIG. 1, it includes a cell substrate 02 and any of the array substrates 01 described above, and a liquid crystal layer (not shown in FIG. 1) and a plurality of spacers 03 disposed between the cell substrate 02 and the array substrate 01.

The plurality of spacers 03 are arranged on a surface of a side of the cell substrate 02 close to the array substrate 01 to support the cell substrate 02 and the array substrate 01, and the surface of the respective one of the spacers 03 facing the array substrate 01 is abutted against or disposed oppositely to a surface of the respective one of the spacing areas A facing the cell substrate 02.

As the display panel includes the array substrate 01 described above, it can be understood by those skilled in the art that the display panel has advantages of the array substrate 01 according to the present disclosure, which will not be repeatedly described here again.

The spacer 03 can be formed on the cell substrate 02 by a patterning process such as masking and photoetching. After the cell substrate 02 and the array substrate 01 are aligned, the spacer 03 located between the cell substrate 02 and the array substrate 01 supports the cell substrate 02 and the array substrate 01 to maintain the cell thickness.

Optionally, the plurality of spacers 03 may include a main spacer 031 and an auxiliary spacer 032. In the normal direction of the base substrate 11, the thickness of the main spacer 031 may be larger than that of the auxiliary spacer 032.

Accordingly, the plurality of spacing areas A may include a main spacing area A1 and an auxiliary spacing area A2. A surface of the main spacer 031 facing the array substrate 01 is abutted against a surface of the main spacer A1 facing the cell substrate 02, and a surface of the auxiliary spacer 032 facing the array substrate 01 is disposed oppositely to a surface of the auxiliary spacer A facing the cell substrate 02.

The inventor found that when a refresh rate of the display panel is high, the uneven display in the dark state caused by pressing the display panel is more significant. In order to improve the refresh speed, a cell thickness of a display panel with a high refresh rate is smaller than that of a display panel with a low refresh rate, and thus heights of the main spacer and the auxiliary spacer are both reduced, which leads to increase of rigidity of the spacers, and it is more difficult for the spacer to pass over a barrier to recover to its original state when it encounters the barrier after being bent by a force. According to specifications and requirements for response time of a display panel, a cell thickness of the display panel with the high refresh rate ranges from about 2.0 to 2.6 microns, such as is 2.3 microns, while the cell thickness of the display panel with the low refresh rate is about 3.0 microns, such as 3.4 microns. When the array substrate 01 according to the present disclosure is applied to the display panel with the high refresh rate, the uneven display in the dark state can be significantly improved.

Optionally, the array substrate 01 according to the present disclosure can be applied to a display panel with a refresh rate greater than or equal to 120 Hz, which is not limited in the present disclosure.

The inventor found that when a resolution of the display panel is high, the uneven display in the dark state caused by pressing the display panel is more significant. In order to improve the resolution, a sub-pixel size of a display panel with a high resolution is smaller than that of a display panel with a low resolution, so it is difficult to solve a problem simply by increasing a distance between spacer and common metal layer. According to specifications and requirements for a resolution of a display panel, different setting methods can be selected, and for example, a method in which a gap is disposed on a metal wire can be selected for products with a QHD resolution and above.

The inventor found that when a size of the display panel is large, the uneven display in the dark state caused by pressing the display panel is more significant, such as for MNT/TV products, due to a more significant stress inside a large panel and due to an easy displacement of the spacer caused by screen's gravity. When the array substrate 01 according to the present disclosure is applied to a large-size display panel, the uneven display in the dark state can be significantly improved.

When the array of thin film transistors 12 in the array substrate 01 includes a plurality of thin film transistors 12, optionally, the orthographic projection of the spacer 03 on the base substrate 11 may be located within the range of the orthographic projection of the thin film transistors 12 on the base substrate 11. In this way, the influence of the spacer 03 on the aperture ratio can be avoided.

Referring to FIGS. 5 and 6, the display panel may include a plurality of sub-pixels arrayed along a row direction and along a column direction, and the plurality of sub-pixels include a first color sub-pixel R, a second color sub-pixel G, and a third color sub-pixel B. Sub-pixels on a same column can have a same color.

As shown in FIGS. 5 and 6, one first color sub-pixel R, one second color sub-pixel G, and one third color sub-pixel B arranged in sequence along the row direction constitute a white pixel.

The plurality of metal wires in the common metal layer 14 may include a plurality of vertical metal wires 103 extending along the column direction. The vertical metal wires 103 can be arranged in various ways.

In the first implementation, as shown in FIG. 5, the main spacing area A1 is arranged in a third color sub-pixel B, the vertical metal wire 103 is located between a third color sub-pixel B and a first color sub-pixel R which are adjacently arranged in the row direction, and the vertical metal wire 103 is located between a first color sub-pixel R and a second color sub-pixel G which are adjacently arranged in the row direction.

As shown in FIG. 5, two vertical metal wires 103 are arranged in each white pixel, that is, among three color sub-pixels, only the first color sub-pixel R and the second color sub-pixel G are provided with a vertical metal wire 103, and the third color sub-pixel B is not provided with the vertical metal wire 103.

Since the main spacing area A1 is arranged in the third color sub-pixel B, display uniformity of the third color sub-pixel B can be improved by removing a vertical metal wire 103 provided correspondingly to the third color sub-pixel.

In the second implementation, as shown in FIG. 6, the main spacing area A1 is arranged in the third color sub-pixel B, and the vertical metal wire 103 is located between a third color sub-pixel B and a first color sub-pixel R which are adjacently arranged in the row direction.

In the implementation, one vertical metal wire 103 is disposed at each white pixel, that is, among the three color sub-pixels, only the first color sub-pixel R is correspondingly provided with the vertical metal wire 103, and the second color sub-pixel G and the third color sub-pixel B are not correspondingly provided with the vertical metal wire 103.

In the implementation, by disposing one vertical metal wire 103 at each white pixel, display uniformity among white pixels can be ensured, and the free sliding range of the spacer 03 can be maximized, further reducing probability of the spacer 03 being caught, facilitating quick recovering of the spacer 03 to its original state and improving the uneven display in dark state caused by touching the display panel.

In the second implementation, the vertical metal wire 103 is located between the third color sub-pixel B and the first color sub-pixel R which are adjacently arranged in the row direction. In a specific implementation, the vertical metal wire 103 may also be located between the first color sub-pixel R and the second color sub-pixel G which are adjacently arranged in the row direction.

That is, one vertical metal wire 103 is disposed at each white pixel, only the second color sub-pixel G is correspondingly provided with the vertical metal wire 103, and the first color sub-pixel R and the third color sub-pixel B are not correspondingly provided with the vertical metal wire 103.

Optionally, the first color sub-pixel R is a red sub-pixel, the second color sub-pixel G is a green sub-pixel, and the third color sub-pixel B is a blue sub-pixel, which is not limited in the present disclosure.

The present disclosure provides a display apparatus, including the display panels according to any one of the embodiments described above.

Since the display apparatus includes the display panel described above, it can be understood by those skilled in the art that the display apparatus has advantages of the display panel according to the present disclosure, which will not be repeatedly described here again.

It should be noted that the display apparatus in the embodiment can be any product or component with 2D or 3D display function, such as an electronic paper, a mobile phone, a tablet computer, a television, a notebook computer, a digital photo frame, a virtual reality device, a augmented reality device, an under display camera device and a navigator and so on.

All the embodiments in this specification are described in a progressive way, and each embodiment focuses on differences from other embodiments. The same and similar parts among the embodiments can be referred to each other.

Finally, it should be noted that in this document, relational terms such as "first" and "second" are only used to distinguish one entity or operation from another entity or operation, and do not necessarily require or imply any such actual relationship or sequence among these entities or operations. Moreover, terms "comprising", "including" or any other variation thereof are intended to encompass a non-exclusive inclusion, so that a process, method, article or device including a series of elements includes not only those elements, but also other elements not explicitly listed, or elements inherent to such a process, method, article or device. Without further restrictions, an element defined by the statement "includes a . . . " does not exclude presence of other identical elements in the process, method, article or apparatus including the element.

The array substrate, display panel and display apparatus according to the above disclosure are introduced in detail. In this document, specific examples are used to explain principle and implementations of the disclosure. Explanations of the embodiments described above are only used to facilitate understanding of methods and core ideas of the disclosure. Meanwhile, changes can be made to the specific implementation and application scope by ordinary skilled in the art according to the ideas of the present disclosure. To sum up, contents of this specification should not be construed as limitation to the present disclosure.

Other embodiments of the present disclosure will readily occur to those skilled in the art with considering the specification and practicing the disclosure provided herein. The present disclosure is intended to cover any variations, uses or adaptations of the present disclosure, which follow general principles of the present disclosure and include common knowledge or customary practice in the art not provided in the present disclosure. The specification and embodiments are regarded to be exemplary only, and a true scope and spirit of the present disclosure are indicated by following claims.

It should be understood that the present disclosure is not limited to a precise structure described above and shown in the drawings, and various modifications and changes can be made without departing from its scope. The scope of the present disclosure is limited only by appended claims.

Reference to "one embodiment", "an embodiment" or "one or more embodiments" herein means that a specific feature, structure or characteristic described in connection with embodiments is included in at least one embodiment of the present disclosure. In addition, it is noted that an example of a word "in one embodiment" here do not necessarily refer to a same embodiment.

In the specification provided here, numerous specific details are set forth. However, it can be understood that the embodiments of the present disclosure can be practiced without these specific details. In some instances, well-known methods, structures and techniques have not been shown in detail in order not to obscure understanding of this specification.

In the claims, any reference signs between parentheses shall not be construed as limitations on the claims. A word "comprising" does not exclude presence of elements or steps not listed in a claim. A word "a" or "an" preceding an element does not exclude presence of a plurality of such elements. The present disclosure can be realized by means of hardware including several different elements and by means of a suitably programmed computer. In a unit claim enumerating several device, several of these device can be embodied by a same item of hardware. Use of words "first", "second", "third", etc. does not indicate any order. These words can be interpreted as names.

Finally, it should be noted that the above embodiments are only intended to illustrate technical schemes of the present disclosure, but not to limit it. Although the present disclosure has been described in detail with reference to the foregoing embodiments, it should be understood by ordinary skilled in the art that modifications can be made to the technical schemes described in the foregoing embodiments, or equivalent substitutions can be made to some technical features thereof. These modifications or substitutions do not make essence of corresponding technical schemes depart from the spirit and scope of the technical schemes of the embodiments of the present disclosure.

The invention claimed is:

1. A display panel, comprising a cell substrate, an array substrate, and a liquid crystal layer and a plurality of spacers disposed between the cell substrate and the array substrate, wherein the array substrate comprises a base substrate;

the plurality of spacers are arranged on a surface of a side of the cell substrate close to the array substrate, for supporting the cell substrate and the array substrate, the array substrate comprises a plurality of spacing areas, and a surface of respective one of the spacing areas facing the cell substrate is configured to be abutted against or to be disposed oppositely to a surface of respective one of the spacers facing the array substrate, and the plurality of spacing areas comprising a main spacing area and an auxiliary spacing area, wherein the plurality of spacers comprise a main spacer and an auxiliary spacer, a surface of the main spacing area facing the cell substrate is configured to be abutted against a surface of the main spacer facing the array substrate, a surface of the auxiliary spacing area facing the cell substrate is configured to be disposed oppositely to a surface of the auxiliary spacer facing the array substrate, and a thickness of the main spacer is larger than a thickness of the auxiliary spacer in a normal direction of the base substrate;

and the array substrate further comprises:

an array of thin film transistors disposed on a side of the base substrate, wherein the array of thin film transistors comprises a semiconductor layer; and a common metal layer disposed on a side of the array of thin film transistors away from the base substrate;

wherein an orthographic projection of the common metal layer on the base substrate does not overlap with an orthographic projection of the semiconductor layer on the base substrate, the common metal layer comprises a plurality of metal wires arranged in an intersecting manner, the metal wires are provided with a gap, and the main spacing area is disposed at or close to a center of an orthographic projection of the gap on the base substrate;

wherein the array substrate further comprises a plurality of pixel units arrayed in a row direction and in a column direction;

the array of thin film transistors further comprises a grid line metal layer and a second insulating layer arranged in layer configuration on a side of the semiconductor layer close to the base substrate, the semiconductor layer is arranged on a side of the second insulating layer away from the base substrate, and the grid line metal layer comprises a plurality of grid lines extending along the row direction;

the plurality of metal wires comprise a plurality of transverse metal wires extending along the row direction;

in the column direction, orthographic projections of the plurality of transverse metal wires on the base substrate are located within a range of orthographic projections of the grid lines on the base substrate, or the orthographic projections of the plurality of transverse metal wires on the base substrate cover the orthographic projections of the grid lines on the base substrate, or the orthographic projections of the plurality of transverse metal wires on the base substrate completely or partially overlap with the orthographic projections of the grid lines on the base substrate;

the array of thin film transistors further comprises a data line metal layer disposed on a side of the semiconductor layer away from the base substrate, the data line metal layer comprising a plurality of data lines extending along the column direction:

the plurality of metal wires further comprises a plurality of vertical metal wires extending along the column direction, and each of the plurality of vertical metal wires comprises a plurality of metal wire segments, wherein the plurality of metal wire segments are parallel to the plurality of data lines;

in the row direction, orthographic projections of the plurality of metal wire segments on the base substrate are located within a range of orthographic projections of the data lines on the base substrate, or the orthographic projections of the plurality of metal wire segments on the base substrate cover the orthographic projections of the data lines on the base substrate, or the orthographic projections of the plurality of metal wire segments on the base substrate completely or partially overlap with the orthographic projections of the data lines on the base substrate;

the gap is further formed by removing metal of one of the plurality of transverse metal wires between two of the plurality of vertical metal wires respectively adjacent to the main spacing area and by removing metal of one of the plurality of vertical metal wires between two of the plurality of transverse metal wires respectively adjacent to the main spacing area;

a distance between the two of the plurality of vertical metal wires respectively adjacent to the main spacing area in the row direction is equal to a size of two pixel units in the row direction; and a distance between the two of the plurality of transverse metal wires respectively adjacent to the main spacing area in the column direction is equal to a size of two pixel units in the column direction.

2. The display panel according to claim 1, wherein a minimum distance between the orthographic projection of the common metal layer on the base substrate and the auxiliary spacing area is greater than or equal to 12.5 microns.

3. The display panel according to claim 1, wherein a hollowed hole is disposed at an intersection of one of the plurality of transverse metal wires and one of the plurality of vertical metal wires, and the auxiliary spacing area is located within a range of an orthographic projection of the hollowed hole on the base substrate.

4. The display panel according to claim 1, wherein a bent portion is disposed on one of the plurality of transverse metal wires and/or one of the plurality of vertical metal wires, and an orthographic projection of the bent portion on the base substrate partially surrounds the auxiliary spacing area.

5. The display panel according to claim 1, wherein a minimum distance between the orthographic projection of the common metal layer on the base substrate and the main spacing area is greater than or equal to 25 microns.

6. The display panel according to claim 1, wherein each of the pixel units comprises two domain areas divided by a boundary line of domain areas;

wherein an orthographic projection of one of the plurality of transverse metal wires on the base substrate is located at a position of the boundary line of domain areas in the pixel units.

7. The display panel according to claim 1, wherein the array substrate further comprises at least one of:

a first transparent electrode layer disposed on a surface of a side of the common metal layer away from the base substrate;

a planarization layer disposed between the array of thin film transistors and the common metal layer, wherein a material of the planarization layer is an organic insulating material;

a second transparent electrode layer disposed between the planarization layer and the common metal layer; and a first insulating layer disposed between the second transparent electrode layer and the common metal layer.

8. The display panel according to according to claim 1, wherein the pixel units comprise a plurality of sub-pixels arrayed along the row direction and along the column direction, and the plurality of sub-pixels comprise a first color sub-pixel, a second color sub-pixel, and a third color sub-pixel;

wherein the main spacing area is arranged in the third color sub-pixel; the plurality of vertical metal wires are located between the third color sub-pixel and the first color sub-pixel which are adjacently arranged in the row direction, and/or the plurality of vertical metal wires are located between the first color sub-pixel and the second color sub-pixel which are adjacently arranged along the row direction.

9. The display panel according to claim 8, wherein the first color sub-pixel is a red sub-pixel, the second color sub-pixel is a green sub-pixel, and the third color sub-pixel is a blue sub-pixel.

10. A display apparatus, comprising the display panel according to claim 1.

* * * * *